(12) United States Patent
Zou et al.

(10) Patent No.: US 11,024,773 B2
(45) Date of Patent: Jun. 1, 2021

(54) MICRO-LED WITH VERTICAL STRUCTURE, DISPLAY DEVICE, ELECTRONICS APPARATUS AND MANUFACTURING METHOD

(71) Applicant: GOERTEK. INC, Shandong (CN)

(72) Inventors: Quanbo Zou, Shandong (CN); Peixuan Chen, Shandong (CN); Xiangxu Feng, Shandong (CN)

(73) Assignee: GOERTEK. INC, Shandong (CN)

(*) Notice: Subject to any disclaimer, the term of this patent is extended or adjusted under 35 U.S.C. 154(b) by 0 days.

(21) Appl. No.: 16/347,603

(22) PCT Filed: Nov. 6, 2016

(86) PCT No.: PCT/CN2016/104927
§ 371 (c)(1),
(2) Date: May 6, 2019

(87) PCT Pub. No.: WO2018/082101
PCT Pub. Date: May 11, 2018

(65) Prior Publication Data
US 2019/0334060 A1    Oct. 31, 2019

(51) Int. Cl.
*H01L 33/38* (2010.01)
*H01L 27/32* (2006.01)
*H01L 33/14* (2010.01)
*H01L 33/40* (2010.01)
*H01L 33/52* (2010.01)

(52) U.S. Cl.
CPC ............ *H01L 33/385* (2013.01); *H01L 27/32* (2013.01); *H01L 33/14* (2013.01); *H01L 33/405* (2013.01); *H01L 33/52* (2013.01); *H01L 2933/005* (2013.01); *H01L 2933/0016* (2013.01)

(58) Field of Classification Search
CPC combination set(s) only.
See application file for complete search history.

(56) References Cited

U.S. PATENT DOCUMENTS

| | | | |
|---|---|---|---|
| 2005/0199896 A1 | 9/2005 | Kaneko et al. | |
| 2011/0127565 A1* | 6/2011 | Son | H01L 33/385 257/99 |
| 2011/0156089 A1* | 6/2011 | Hwang | H01L 33/14 257/99 |
| 2013/0049036 A1* | 2/2013 | Jeong | H01L 27/153 257/91 |

(Continued)

FOREIGN PATENT DOCUMENTS

| CN | 102117874 A | 7/2011 |
|---|---|---|
| CN | 102810550 A | 12/2012 |

(Continued)

*Primary Examiner* — Nduka E Ojeh
(74) *Attorney, Agent, or Firm* — Ajay A. Jagtiani; Miles & Stockbridge P.C.

(57) ABSTRACT

The present invention discloses a micro-LED with vertical structure, display device, electronics apparatus and manufacturing method. The micro-LED with vertical structure comprises: a bottom electrode bonded on a display substrate; a first type doped region provided above the bottom electrode; a second type doped region provided above the first type doped region; and a side-contact electrode covering at least one part of a peripheral of the second type doped region.

6 Claims, 4 Drawing Sheets

(56) References Cited

U.S. PATENT DOCUMENTS

| | | |
|---|---|---|
| 2016/0079478 A1 | 3/2016 | Kong et al. |
| 2016/0126224 A1* | 5/2016 | Lee .................. H01L 33/005 257/89 |
| 2017/0012026 A1* | 1/2017 | Choi .................. H01L 33/60 |

FOREIGN PATENT DOCUMENTS

| | | |
|---|---|---|
| CN | 103227260 A | 7/2013 |
| KR | 20120088047 A | 8/2012 |

* cited by examiner

MICRO-LED WITH VERTICAL STRUCTURE, DISPLAY DEVICE, ELECTRONICS APPARATUS AND MANUFACTURING METHOD

CROSS-REFERENCE TO RELATED APPLICATIONS

This application is a National Stage of International Application No. PCT/CN2016/104927 filed on Nov. 7, 2016, which is incorporated herein by reference in its entirety.

FIELD OF THE INVENTION

The present invention relates to the field of micro-LED, and more specifically, relates to a micro-LED with vertical structure, a display device, an electronics apparatus and a method for manufacturing a display device.

BACKGROUND OF THE INVENTION

The micro-LED technology refers to the LED array of small size integrated on a substrate with high density. Currently, the micro-LED technology is starting development, and it is expected in the industry that a high-quality micro-LED product comes into the market. High-quality micro-LEDs will have a deep affection on the conventional display products such as LCD/OLED that have already been put into the market.

In the prior art, a micro-LED arranged on a display device such as a display panel can have a vertical structure to achieve a high definition. In such a micro-LED, a top electrode is arranged on top of the micro-LED and contacts the top surface of the micro-LED to form a common electrode. The micro-LED emits light from the top surface. The top electrode is transparent.

For example, U.S. Pat. No. 9,367,094 B2 discloses a display module and system application, which is hereby incorporated herein by reference.

Generally, the top electrode is a cathode and is in an Ohmic contact with the n-EPI surface of the micro-LED. The n-EPI region shall be etched deeply to reach the heavy doping region of n-EPI (e.g., N++ GaN region). This deep etching will add processing complexity. As a result, a cost/yield/reliability issues will rise.

In addition, the conductive top electrode will degrade optical efficiency, to an extend of around 5~20%, for example, due to its imperfect optical transmittance.

In addition, in such a micro-LED, a side light leakage may decrease the optical efficiency thereof. This may become even more serious when a micro-LED has a small size, for example, equal to or less than 10 μm, for a high-resolution display.

In addition, in such a micro-LED, heat dissipation is limited to the bottom and top surfaces thereof. This is insufficient in a small micro-LED for a high resolution. This may cause an overheating issue. Accordingly, the efficiency and/or lifetime of the micro-LED may degrade.

Therefore, there is a demand in the art that a new solution for a micro-LED of vertical structure shall be proposed to address at least one of the problems in the prior art.

SUMMARY OF THE INVENTION

One object of this invention is to provide a new technical solution for a micro-LED with vertical structure.

According to a first aspect of the present invention, there is provided a micro-LED with vertical structure, comprising: a bottom electrode bonded on a display substrate; a first type doped region provided above the bottom electrode; a second type doped region provided above the first type doped region; and a side-contact electrode covering at least one part of a peripheral of the second type doped region.

Alternatively or optionally, a multiple quantum well layer is provided between the first type doped region and the second type doped region.

Alternatively or optionally, a mirror is provided below the first type doped region.

Alternatively or optionally, the first type doped region is a p-type doped region, and the second type doped region is a n-type doped region.

Alternatively or optionally, the at least one part of the peripheral of the second type doped region includes a heavily doped second type region.

Alternatively or optionally, a protective layer is provided on top of the second type doped region.

Alternatively or optionally, a vacancy beside the side-contact electrode is filled with the protective layer.

Alternatively or optionally, a vacancy beside the side-contact electrode is filled with an encapsulation filler.

Alternatively or optionally, the side-contact electrode is a conductive encapsulation filler, which is at the peripheral of the second type doped region.

According to a second aspect of the present invention, there is provided display device, comprising a micro-LED with vertical structure according to the present invention.

According to a third aspect of the present invention, there is provided an electronics apparatus, comprising a display device according to the present invention.

According to a fourth aspect of the present invention, there is provided a method for manufacturing a display device, comprising: transferring a micro-LED with vertical structure onto a display substrate, wherein the micro-LED include a bottom electrode, a first type doped region provided above the bottom electrode and a second type doped region provided above the first type doped region, and wherein the bottom electrode is bonded on the display substrate; forming a dielectric layer at a peripheral of the micro-LED, wherein least one part of a peripheral of the second type doped region is exposed; forming a side-contact electrode covering at least one part of the peripheral of the second type doped region; and forming a protective layer on top of the micro-LED.

Alternatively or optionally, forming a side-contact electrode further comprises: depositing a material of the side-contact electrode on a surface of the second type doped region; coating and baking a photoresist outside the material of the side-contact electrode; etching back the photoresist to expose the material of the side-contact electrode on a top of the second type doped region; removing the material of the side-contact electrode on the top of the second type doped region; and stripping the photoresist.

Alternatively or optionally, forming a side-contact electrode further comprises: depositing a material of the side-contact electrode on a surface of the second type doped region; filling an encapsulation filler outside the material of the side-contact electrode; and grinding the encapsulation filler to remove the material of the side-contact electrode on the top of the second type doped region.

Alternatively or optionally, forming a side-contact electrode further comprises: filling a conductive encapsulation filler as the side-contact electrode at the peripheral of the second type doped region.

Alternatively or optionally, filling a conductive encapsulation filler further comprises: grinding and polishing the conductive encapsulation filler.

According to an embodiment of this invention, the present invention can provide a side-contact electrode for a micro-LED to reduce the optical loss caused by an electrode on the top of a micro-LED.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
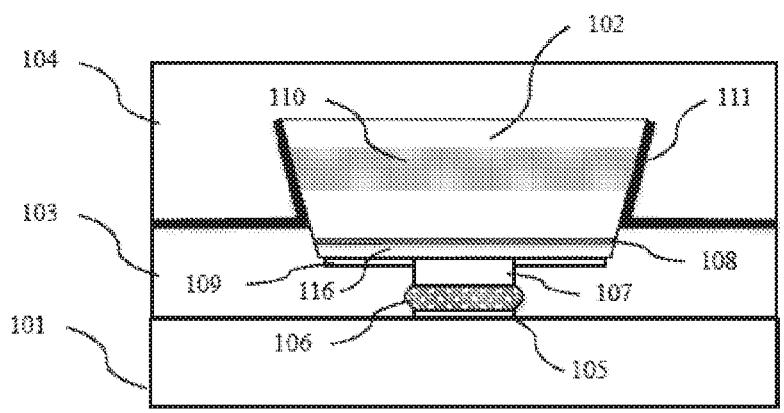
FIG. 1 schematically shows a structure of a micro-LED according to an embodiment of this invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

The present invention has proposed to introduce a side electrode for a top common electrode in a micro-LED with vertical structure.

Embodiments and examples will be described with reference to the drawings in details.

FIG. 1 schematically shows a structure of a micro-LED according to an embodiment of this invention.

As shown in FIG. 1, the micro-LED with vertical structure comprises: a bottom electrode 107 bonded on a display substrate 101, a first type doped region 116 provided above the bottom electrode 107, a second type doped region 102 provided above the first type doped region 116 and a side-contact electrode 111 covering at least one part of a peripheral of the second type doped region 102.

For example, the side-contact electrode 111 may include Ag, Al, Cr, Au, Ni, NiV, or ITO.

For example, the first type doped region 116 is a p-type doped region, and the second type doped region 102 is a n-type doped region. The at least one part of the peripheral of the second type doped region 102 may include a heavily doped second type region 110, which may be a N++ GaN region.

As also shown in FIG. 1, a multiple quantum well layer MQW 108 may be provided between the first type doped region 116 and the second type doped region 102. A mirror 109 may be provided below the first type doped region 116. The mirror 109 may reflect the light to the top of the micro-LED.

The bottom electrode 107 may be bonded to an electrode 105 such as an anode of the display substrate 101 via a bonding layer 106. The bonding layer 106 may be solder.

In FIG. 1, a dielectric layer 103 may be deposited at the peripheral of the first type doped region 116 and part of the second type doped region 102. The dielectric layer 103 may be polymer such as BCB, PBO and Polyimide, or be SiO2, SiNx, SOG and so on.

A protective layer 104 may be provided on top of the second type doped region 102. For example, a vacancy beside the side-contact electrode 111 is also filled with the protective layer 104. That is, the top and peripheral of the second type doped region 102 are protected by the protective layer 104.

In this embodiment, since a side-contact electrode is provided, the EPI region may not be deeply etched and thus the processing may be simplified.

Because the electrode is not arranged on the top of the micro-LED, the optical loss due to electrode transmittance will be cancelled. This may provide a higher optical efficiency.

Because the electrode is arranged on the side of the micro-LED, it may be used to prevent light leakage. For example, the side-contact electrode is a reflective side-contact metal.

The side-contact electrode may be side-contact metallic electrode and it can enhance the heat dissipation to the display substrate. This may provide a better thermal power management.

Figure 2:
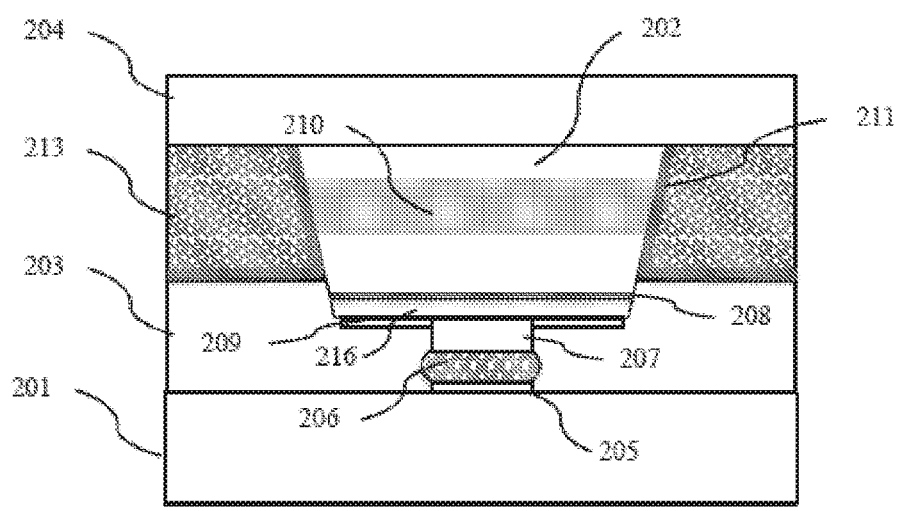
FIG. 2 schematically shows a structure of a micro-LED according to another embodiment of this invention.

FIG. 2 schematically shows a structure of a micro-LED according to another embodiment of this invention.

In FIG. 2, the bottom electrode 207 of the micro-LED is bonded to an electrode 205 such as an anode of a display substrate 201 via a bonding layer 206. The first type doped region 216 is above the bottom electrode 207. The bottom of the first type doped region 216 is covered with a mirror 209. A dielectric layer 203 may be deposited at the peripheral of the first type doped region 216 and part of the second type doped region 202.

The second type doped region 202 is above the first type doped region 216. A multiple quantum well layer MQW 208 is provided between the first type doped region 216 and the second type doped region 202.

A side-contact electrode 211 covers at least one part of a peripheral of the second type doped region 202 including a heavily doped second type region 210. A protective layer 204 is provided on top of the second type doped region 202.

The difference between the embodiments of FIG. 1 and FIG. 2 lies in that a vacancy beside the side-contact electrode is filled with an encapsulation filler 213. The description repetitive with the embodiment of FIG. 1 will be omitted.

With the structure of FIG. 2, during manufacturing of the micro-LED, the encapsulation filler 213 may be filled, for example, after a deposition of the side-contact electrode 211 outside the second type doped region 202.

For example, the encapsulation filler 213 can be photoresist, and it can be formed by coating. The encapsulation filler 213 may be thinned through etch-back by plasma or reactive ion etching (ME). The electrode on top of the second type doped region 202 may be removed through wet chemical etching or dry etching.

Alternatively, the encapsulation filler 213 may be molding compound, curable paste, polymer or elastomer. For example, the side-contact electrode 211 on the top of the second type doped region 202 may be removed by simply grinding and/or polish the encapsulation filler 213 and the side-contact electrode 211.

Figure 3:
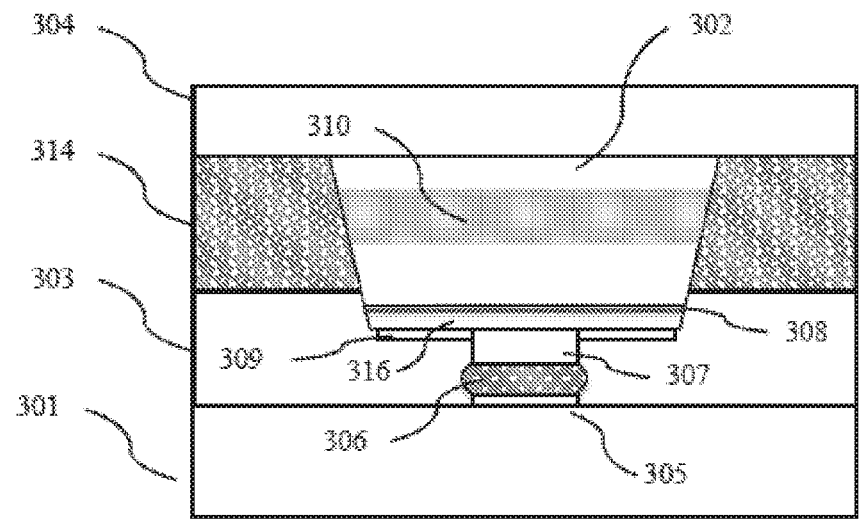
FIG. 3 schematically shows a structure of a micro-LED according to another embodiment of this invention.

FIG. 3 schematically shows a structure of a micro-LED according to another embodiment of this invention.

In FIG. 3, the bottom electrode 307 of the micro-LED is bonded to an electrode 305 such as an anode of a display substrate 301 via a bonding layer 306. The first type doped region 316 is above the bottom electrode 307. The bottom of the first type doped region 316 is covered with a mirror 309. A dielectric layer 303 may be deposited at the peripheral of the first type doped region 316 and part of the second type doped region 302.

The second type doped region 302 is above the first type doped region 316. A multiple quantum well layer MQW 308 is provided between the first type doped region 316 and the second type doped region 302.

A protective layer 304 is provided on top of the second type doped region 302.

The difference between the embodiments of FIG. 1 and FIG. 2 lies in that the side-contact electrode is a conductive encapsulation filler 314, which is at the peripheral of the second type doped region 302. The description repetitive with the above embodiments will be omitted.

In this embodiment, the conductive encapsulation filler 314 can be filled around the second type doped region 302. It can be etched back, be ground and/or polished to expose the top of the region 302. In this regard, an electrode deposition is not necessary and the manufacture processing may be simplified. For example, the conductive encapsulation filler 314 may be silver paste. Because the top electrode is generally a common electrode, the conductive encapsulation filler 314 will not have influence on the performance and functionality of the micro-LED.

It can be understood by a person skilled in the art that the side-contact electrode may be patterned or un-patterned according a design.

FIGS. 4-7 schematically shows a process of manufacturing a display device according to another embodiment of this invention.

Figure 4:
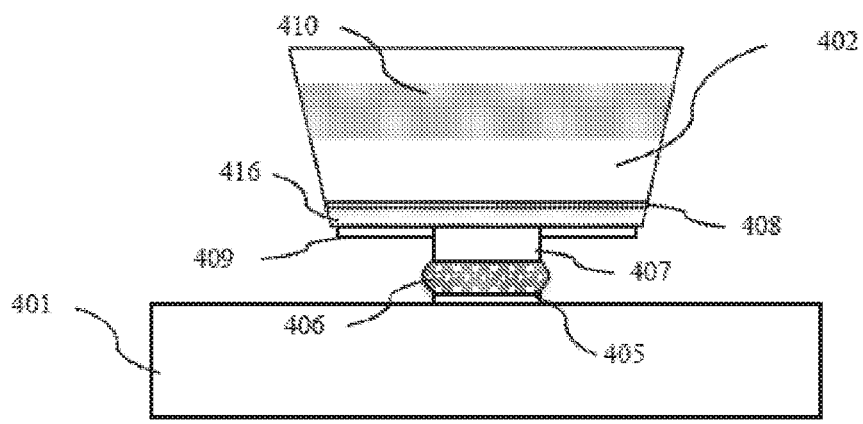
FIGS. 4-7 schematically shows a process of manufacturing a display device according to another embodiment of this invention.

As shown in FIG. 4, a micro-LED with vertical structure is transferred onto a display substrate 401. The micro-LED include a bottom electrode 407, a first type doped region 416 provided above the bottom electrode 407 and a second type doped region 402 provided above the first type doped region 416. The bottom electrode 407 is bonded on an electrode 405 such as an anode of the display substrate 401 via a bonding layer 406 such as solder.

A multiple quantum well layer MQW 408 is provided between the first type doped region 416 and the second type doped region 402. A mirror 409 is provided below the first type doped region 416. The second type doped region 402 includes a heavily doped second type region 410.

Figure 5:
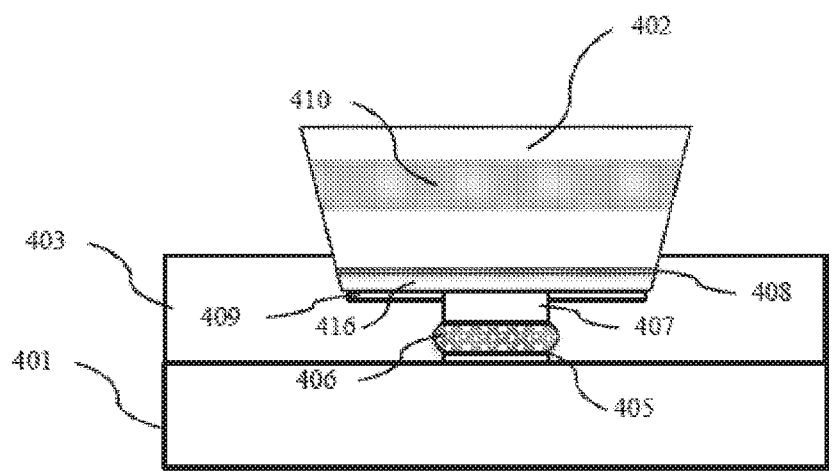

As shown in FIG. 5 a dielectric layer 403 is formed at a peripheral of the micro-LED, wherein least one part of a peripheral of the second type doped region 402 is exposed. The exposed part includes the heavily doped second type region 410. The multiple quantum well layer MQW 408 is not exposed and is encapsulated by the dielectric layer 403.

Figure 6:
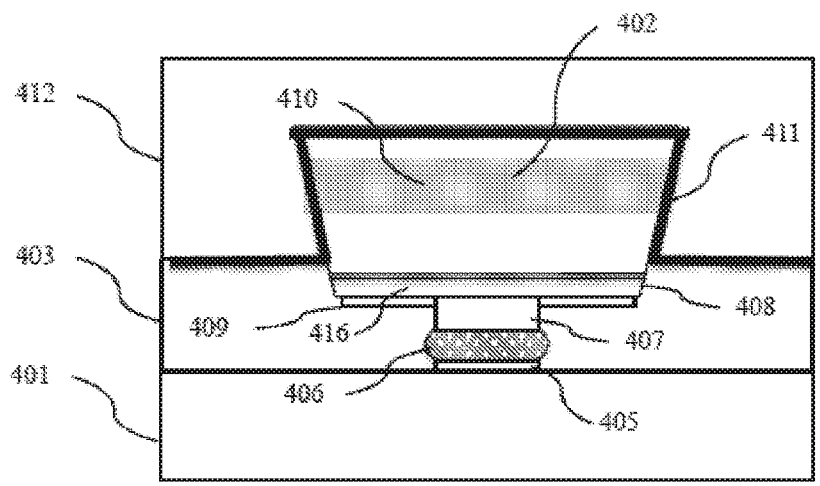

As shown in FIG. 6, a side-contact electrode is formed, which covers at least one part of the peripheral of the second type doped region 402.

In FIG. 6, the side-contact electrode 411 may be formed by depositing a material of the side-contact electrode on a surface of the second type doped region 402; coating and baking a photoresist 412 outside the material of the side-contact electrode 411; etching back the photoresist 412 to expose the material of the side-contact electrode 411 on a top of the second type doped region 402; removing the material of the side-contact electrode 411 on the top of the second type doped region 402; and stripping the photoresist 412. This approach may form a micro-LED like that in FIG. 1.

Alternatively, a micro-LED like that in FIG. 2 or 3 may be formed.

For example, the side-contact electrode 411 may be formed by depositing a material of the side-contact electrode on a surface of the second type doped region 402; filling an encapsulation filler outside the material of the side-contact electrode 411; and grinding the encapsulation filler to remove the material of the side-contact electrode 411 on the top of the second type doped region 402.

For example, the side-contact electrode may be formed by filling a conductive encapsulation filler as the side-contact electrode at the peripheral of the second type doped region 402. Then, the conductive encapsulation filler is ground and polished to expose the top of the region 402.

Figure 7:
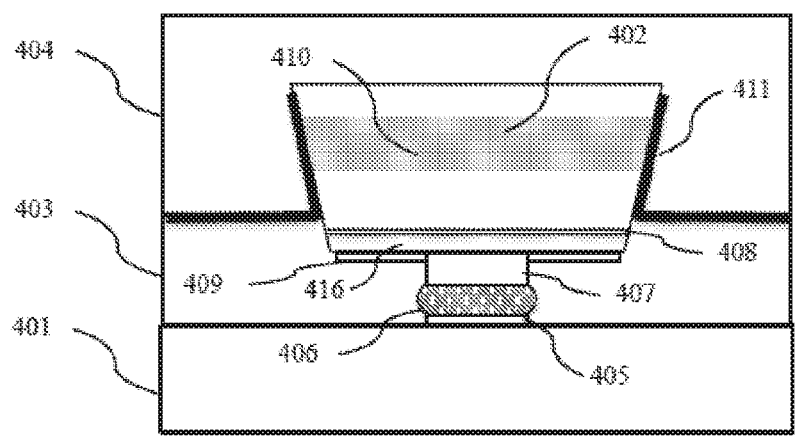

As shown in FIG. 7, a protective layer 404 is formed on top of the micro-LED.

In another embodiment, the present invention further includes a display device such as a display screen device or display panel, comprising a micro-LED with vertical structure according to any of the embodiments according to the present invention.

In another embodiment, the present invention further includes an electronic apparatus. The electronic apparatus contains a display device according to the present invention. For example, the electronic apparatus can be a mobile phone, a pad computer and so on.

Although some specific embodiments of the present invention have been demonstrated in detail with examples, it should be understood by a person skilled in the art that the above examples are only intended to be illustrative but not to limit the scope of the present invention.

What is claimed is:

1. A method for manufacturing a display device, comprising:

transferring a micro-LED with vertical structure onto a display substrate, wherein the micro-LED include a bottom electrode, a first type doped region provided above the bottom electrode and a second type doped region provided above the first type doped region, and wherein the bottom electrode is bonded on the display substrate;

forming a dielectric layer at a peripheral of the micro-LED, wherein at least one part of a peripheral of the second type doped region is exposed;

forming a side-contact electrode covering at least one part of the peripheral of the second type doped region; and forming a protective layer on top of the micro-LED, wherein the side-contact electrode is side-contact metallic electrode, and is in direct contact with the at least one part of a peripheral of the second type doped region, wherein forming a side-contact electrode further comprises:

depositing a material of the side-contact electrode on a surface of the second type doped region;

coating and baking a photoresist outside the material of the side-contact electrode;

etching back the photoresist to expose the material of the side-contact electrode on a top of the second type doped region;

removing the material of the side-contact electrode on the top of the second type doped region; and stripping the photoresist.

2. The method according to claim 1, wherein forming a side-contact electrode further comprises:

filling a conductive encapsulation filler as the side-contact electrode at the peripheral of the second type doped region.

3. A display device, manufactured by the method according to claim 1.

4. A method for manufacturing a display device, comprising:

transferring a micro-LED with vertical structure onto a display substrate, wherein the micro-LED include a bottom electrode, a first type doped region provided above the bottom electrode and a second type doped region provided above the first type doped region, and wherein the bottom electrode is bonded on the display substrate;

forming a dielectric layer at a peripheral of the micro-LED, wherein at least one part of a peripheral of the second type doped region is exposed;

forming a side-contact electrode covering at least one part of the peripheral of the second type doped region; and forming a protective layer on top of the micro-LED, wherein the side-contact electrode is side-contact metallic electrode, and is in direct contact with the at least one part of a peripheral of the second type doped region, wherein forming a side-contact electrode further comprises:

depositing a material of the side-contact electrode on a surface of the second type doped region;

filling an encapsulation filler outside the material of the side-contact electrode; and grinding the encapsulation filler to remove the material of the side-contact electrode on the top of the second type doped region.

5. The method according to claim 4, wherein forming a side-contact electrode further comprises:

filling a conductive encapsulation filler as the side-contact electrode at the peripheral of the second type doped region.

6. A display device, manufactured by the method according to claim 4.

* * * * *